United States Patent
Andreas

(10) Patent No.: US 7,066,790 B2
(45) Date of Patent: Jun. 27, 2006

(54) CHEMICAL-MECHANICAL POLISHING METHODS

(75) Inventor: Michael T. Andreas, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 466 days.

(21) Appl. No.: 10/108,067

(22) Filed: Mar. 26, 2002

(65) Prior Publication Data

US 2002/0164927 A1 Nov. 7, 2002

Related U.S. Application Data

(63) Continuation of application No. 09/475,545, filed on Dec. 30, 1999, now Pat. No. 6,375,548.

(51) Int. Cl.
*B24B 1/00* (2006.01)

(52) U.S. Cl. .................. 451/41; 451/60; 451/287; 451/288; 451/446

(58) Field of Classification Search ............ 451/41, 451/60, 287, 288, 446
See application file for complete search history.

(56) References Cited

U.S. PATENT DOCUMENTS

| | | | |
|---|---|---|---|
| 4,050,954 A | 9/1977 | Basi | |
| 5,049,200 A | 9/1991 | Brunner | |
| 5,078,801 A | 1/1992 | Malik | |
| 5,704,987 A | 1/1998 | Huynh et al. | |
| 5,750,440 A | * 5/1998 | Vanell et al. | ......... 438/692 |
| 5,855,811 A | 1/1999 | Grieger et al. | |
| 5,858,813 A | * 1/1999 | Scherber et al. | ......... 438/693 |
| 5,996,594 A | 12/1999 | Roy et al. | |
| 6,039,891 A | * 3/2000 | Kaufman et al. | ......... 252/79.1 |
| 6,044,851 A | 4/2000 | Grieger et al. | |
| 6,152,148 A | 11/2000 | George et al. | |
| 6,258,140 B1 | 7/2001 | Shemo et al. | |
| 6,265,781 B1 | 7/2001 | Andreas | |
| 6,345,630 B1 | * 2/2002 | Fishkin et al. | ......... 134/1.3 |

* cited by examiner

*Primary Examiner*—Lee D. Wilson
*Assistant Examiner*—Shantese L. McDonald
(74) *Attorney, Agent, or Firm*—Wells St. John P.S.

(57) ABSTRACT

A chemical-mechanical polishing (CMP) method includes applying a solid abrasive material to a substrate, polishing the substrate, flocculating at least a portion of the abrasive material, and removing at least a majority portion of the flocculated portion from the substrate. Applying solid abrasive material can include applying a CMP slurry or a polishing pad comprising abrasive material. Such a method can further include applying a surfactant comprising material to the substrate to assist in effectuating flocculation of the abrasive material. Such surfactant comprising material may be cationic which includes, for example, a quaternary ammonium substituted salt. Also, for example, the surfactant comprising material may be applied during polishing, brush scrubbing, pressure spraying, or buffing.

20 Claims, No Drawings

CHEMICAL-MECHANICAL POLISHING METHODS

RELATED PATENT DATA

This patent resulted from a continuation application of U.S. patent application Ser. No. 09/475,545, filed on Dec. 30, 1999, now U.S. Pat. No. 6,375,548.

TECHNICAL FIELD

This invention relates to chemical-mechanical polishing methods.

BACKGROUND OF THE INVENTION

Chemical-mechanical polishing (CMP), also known as chemical-mechanical planarization, is widely used in a variety of industries, including the semiconductor processing industry. CMP can remove unwanted material from a substrate, planarize a substrate, and/or create a desired finish on a substrate. All of such intentions may be generically termed "polishing." Generally, the technology involves pressing some sort of solid abrasive material against the substrate to accomplish the polishing and/or planarization. The solid abrasive material may be applied in a CMP slurry of such material and liquid carriers and/or chemically active components as desired. Alternatively, abrasive material may be carried within a polishing pad. Still other techniques are encompassed within the technology.

One common byproduct of CMP is that abrasive material residues often remain on the substrate. In some applications, residual abrasive material can negatively influence subsequent processing and/or result in defective products. Accordingly, a variety of approaches have been attempted to resolve the problem of residual abrasive material.

One conventional approach is to use hydrofluoric acid-based chemistries to undercut particles attached to a silicon oxide substrate. A problem with hydrofluoric acid-based chemistries is that microscratches formed in the substrate as a result of CMP may be aggravated in the acidic conditions. Further, insoluble fluoride compounds may be formed from reactions of hydrofluoric acid with the abrasive material.

Another conventional approach includes application of ammonium hydroxide or tetramethylammonium hydroxide (TMAH) to disperse residual abrasive material. At a high pH, a silicon oxide surface and most abrasive material particles, including ceria, alumina, and silica exhibit a negative surface charge. Such charge characteristics provide electrostatic repulsion. Experimentally, such a method has produced limited benefits and appears to work much better for aluminum oxide particles in comparison to cerium oxide particles.

Still another conventional technique involves etching and/or dissolution of abrasive particles. For cerium oxide particles, such may be accomplished with the application of a mixture of hydrogen peroxide and sulfuric acid. While this method exhibits some effectiveness experimentally, it is incompatible with any surface structures featuring exposed metal.

Accordingly, it is desired to provide a new method for removing CMP residual abrasive material from a substrate.

SUMMARY OF THE INVENTION

In accordance with an aspect of the invention, a chemical-mechanical polishing (CMP) method includes applying a solid abrasive material to a substrate, polishing the substrate, flocculating at least a portion of the abrasive material, and removing at least a majority portion of the flocculated portion from the substrate. Such a method can include polishing with a CMP slurry or polishing pad. It may further include applying a surfactant-comprising material to the substrate to assist in effectuating flocculation of the abrasive material. Such surfactant comprising material may be cationic which includes, for example, a quaternary ammonium substituted salt. Also, for example, the surfactant-comprising material may be applied during polishing, brush scrubbing, pressure spraying, or buffing.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

One aspect of the present invention provides a chemical-mechanical polishing (CMP) method which involves applying a solid abrasive material to a substrate. Such substrate can include a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Applying a solid abrasive material can include applying a CMP slurry of substantially dispersed, solid abrasive material or applying a polishing pad comprising solid abrasive material. A variety of CMP slurries and polishing pads are conceivable that can include a variety of components. Examples of solid abrasive material include cerium oxide, aluminum oxide, mixtures thereof, and combinations thereof with other materials. Preferably, the solid abrasive material comprises ceria. Accordingly, ceria-based abrasive material is also preferred. The solid abrasive material may be substantially dispersed within the CMP slurry, that is, the solid abrasive material is not entirely agglomerated into floccule comprising multiple solid abrasive particles. Depending on the application, some agglomeration of abrasive material particles may be tolerated. However, substantial dispersion alleviates the problem of unnecessary scratching or other similar damage to a substrate from oversized floccule.

The method next comprises polishing the substrate. The parameters under which such polishing is to occur may be established according to the knowledge of those skilled in the technology at the time the method is being practiced. That is, it is contemplated that the present method is applicable both to currently available CMP parameters as well as others that may be later developed.

The method further includes flocculating at least a portion of the abrasive material on the substrate. Such flocculating may occur by a variety of means and at a variety of points within the CMP method. One means for flocculating abrasive material includes applying a surfactant comprising material. A variety of surfactant comprising materials are suitable and may be characterized in a variety of ways.

One such suitable surfactant comprising material exhibits the characteristic of decreasing a settling time for the abrasive material in an aqueous dilution of the slurry. The CMP slurry may be diluted in water, such as de-ionized water, to produce an aqueous dilution of the CMP slurry having a desired concentration of the CMP slurry. For example, the aqueous dilution may comprise 0.1 weight percent (wt %) CMP slurry, 1 wt % slurry, or some other dilution level. The aqueous dilution of the CMP slurry will exhibit a settling time. That is, after a desired amount of time passes, analysis can be conducted to determine the extent to which solid abrasive particles have settled within the aqueous dilution. For example, analysis could occur on 24-hour cycles, or some other duration.

Settling time may vary depending upon a variety of factors, including the dilution level of the CMP slurry (i.e. initial particle concentration in the dilution), pH, and the temperature of the aqueous dilution. It is expected that the most significant decreases in settling time compared to an aqueous dilution without a surfactant comprising material will occur when the temperature of the aqueous dilution does not exceed about 40° Celsius (° C.). A variety of settling times may also be used to measure the effectiveness of a surfactant comprising material. One example of a settling time is the elapsed time beginning from the mixing of a surfactant comprising material with the aqueous dilution up to the time when a designated percentage of the abrasive material has settled from the supernatant of the aqueous dilution. Settling time is considered to decrease if such elapsed time is less for a dilution with the surfactant comprising material.

Another way to characterize settling time is to compare the percentage of abrasive material that has settled from an aqueous dilution of the slurry after a set amount of time, for example, 24 hours. Settling time after addition of a surfactant comprising material is considered to decrease if an increased percentage of abrasive material settles from the supernatant in an aqueous dilution after a designated amount of time passes.

In another aspect of the present invention, a suitable surfactant comprising material exhibits a 1-hour settling rate constant of greater than 0.035 for the abrasive material in an aqueous mixture of about 0.1 wt % surfactant and about 1 wt % CMP slurry containing 3 wt % abrasive material. Alternatively, the settling rate constant may be greater than about 0.09. As indicated above in the discussion on settling time, it may be that the desired 1-hour settling rate constant is achieved when the temperature of the aqueous mixture does not exceed about 40° C. Settling rate constant may be calculated using the following equation:

$$k = \frac{1}{t}\ln\left(\frac{c_0}{c_t}\right)$$

Wherein k is the settling rate constant, t is elapsed time, $c_0$ is the initial concentration, and $c_t$ is concentration at elapsed time t. Accordingly, in calculating the 1-hour settling rate constant, t=1 hour, $c_0$=initial concentration of abrasive material in the supernatant of the about 1 wt % slurry dilution and $c_t$=the concentration of abrasive material in the aqueous dilution after one hour.

The weight percent of abrasive material in the CMP slurry may be known and initial concentration can be calculated given the dilution comprises about 1 wt % slurry. However, improved accuracy in determining settling rate constant is expected when initial concentration is determined by analysis rather than by calculation. Inductively coupled plasma optical emission spectrometry (ICP-OES) is one suitable analysis technique. Other techniques may also be used, such as gravimetric standard methods for determination of percent solids, however, they may be less preferable. Using ICP-OES, the weight percent of a particular metal, such as aluminum or cerium, is determined from the analytical technique and may often be equated with a concentration of abrasive material at a particular time. That is, instead of determining the actual concentration of abrasive material as a whole, the concentration of a tracer material, such as aluminum or cerium, may be determined. Generally, a decrease in the concentration of the tracer material will be proportional to a decrease in the concentration of the abrasive material.

In another aspect of the present invention, a suitable surfactant comprising material may be characterized by its inclusion of particular surfactants. For example, the surfactant may be cationic. Cationic surfactants that are particularly suitable include quaternary ammonium substitute salts, such as a quaternary ammonium halide. Specific suitable surfactants include cetyltrimethylammonium bromide (available as Rhodaquat—242B/99 from Ashland Chemical Co. in Dublin, Ohio) and polyethoxylated quaternary ammonium halide. Examples of polyethoxylated quaternary ammonium halide compounds include ethoxylated stearyl methyl quaternary ammonium chloride and ethoxylated cocoalkyl methyl quaternary ammonium chloride. The two compounds are available as, respectively, Ethoquad 18/25 and Ethoquad C/25 from Akzo Nobel Surface Chemistry Inc. in Stratford, Conn. Of course, given the variety of ways in which a suitable surfactant may be characterized, it is expected that other compounds may also be suitable.

The concentration of the surfactant in the surfactant comprising material can be, for example, about 10 micrograms per milliliter (µg/ml) to about 10,000 µg/ml. Alternatively, the surfactant concentration can comprise about 100 µg/ml to about 1,000 µg/ml.

As indicated, the flocculation may occur under a variety of conditions, but preferably when the temperature of the substrate does not exceed about 40° C. Such temperature limit has been approximated as a point below which improved flocculation is expected. Nevertheless, it is also contemplated that such temperature limit may vary with respect to a particular surfactant, abrasive material, and/or substrate, among other factors. The flocculating can further comprise complexing at least a portion of the abrasive material with a surfactant. Such complexing may in turn form floccule. The formation of floccule is one mechanism contemplated by the present invention by which settling time may be decreased and an appropriate one-hour settling rate constant may be achieved.

As suggested earlier, the flocculating can occur after the polishing. In one aspect of the present invention, it is contemplated that primary polishing of the substrate may be followed by buffing the substrate along with applying a surfactant comprising material and flocculating at least a portion of the abrasive material. Primary polishing can include polishing with a CMP slurry or a polishing pad comprising solid abrasive material. Buffing can be less aggressive, that is, use a softer polishing pad, abrasive material that is less abrasive, and/or less chemically active polishing media. Buffing may occur on a secondary platen of a CMP tool as opposed to a primary platen where primary polishing often occurs. In some contexts, buffing can be considered part of polishing. Thus, flocculating can also occur during polishing.

One potential concern of applying surfactant comprising material during a polishing and/or buffing step is that flocculated particles may produce undesirable scratches or other defects in a substrate. The tendency for such scratches and/or defects to form tends to decrease as the down-force of a polishing surface on a substrate is reduced. Often, the down-force of a polishing surface is less during a buffing step than during a primary polishing step. Accordingly, applying a surfactant comprising material can be conducted during a buffing step, and perhaps another low down-force or lesser aggressive polishing step. Of course, the ability to apply surfactant comprising material during such steps may be influenced by the hardness of abrasive material and/or the substrate being polished or buffed. The softer the substrate and the harder the abrasive material, the more it is likely that scratches or defects may result.

A CMP method according to the present invention further includes removing at least a majority portion of the flocculated portion of the abrasive material from the substrate. Such removal may be accomplished by a variety of means and at a variety of points in a CMP method after flocculation of abrasive material. Accordingly, in one aspect, brush scrubbing the substrate using a scrubbing solution comprising a surfactant material to flocculate abrasive material can remove at least a majority portion of the abrasive material. Brush scrubbing may be performed with a polyvinyl alcohol (PVA) brush. In another aspect, pressure spraying the substrate using a spray solution comprising a surfactant material to flocculate abrasive material can remove at least a majority portion of the abrasive material. Flocculation may also be performed by immersion in an aqueous bath comprising the surfactant material. Of course, it is contemplated that flocculation and/or removal of abrasive material may occur at yet other points in a CMP method. High-pressure spray action may further be used to clean the floccule from the substrate.

EXAMPLE

Aqueous dilutions of the thirteen surfactants listed in Table 1 were prepared at 0.1 wt % concentration using a heat/stir plate and de-ionized water. As mixed, Hitachi shallow trench isolation (STI) slurry containing a ceria abrasive material for CMP was added at approximately 1 wt % loading to form an aqueous dilution of the slurry with each of the thirteen surfactants. The Hitachi STI slurry was also added to de-ionized water at approximately 1 wt % loading as a control. An additional thirteen slurry dilutions with surfactant and one de-ionized water control were prepared using aged, mixed Rodel tungsten CMP (WCMP) slurry containing alumina abrasive material, instead of the Hitachi slurry. Approximately 15 hours after initial preparation, the dilutions were agitated to simulate initial conditions and an approximately 1 ml sample of the supernatant of each solution was diluted 100 to 1 in de-ionized water. The diluted sample was analyzed by ICP-OES with a Varian Liberty 110 unit using a standard V-groove nebulizer and polypropylene spray chamber. Emission spectra were referenced to National Institute of Standards and Technology (NIST) traceable aluminum and cerium calibration standards. Samples were taken and analyses repeated each day for three days, on the seventh day, and on the thirteenth day following the initial agitation. Using the ICP-OES analyses, ceria and alumina concentrations of the aqueous dilutions were calculated and are presented, respectively, in Tables 2 and 3 below. For samples showing visible solids precipitation and an undetectable level of metal content, suspended solids were estimated to be 0 wt %.

TABLE 1

Experimental Surfactants.

| Supplier | Surfactant | Description |
| --- | --- | --- |
| Air Products | CT-131 | anionic/nonionic dispersant |
| | CT-141 | anionic dispersant |
| | CT-324 | wetting agent/dispersant |
| Akzo Nobel | Ethoquad 18/25 | ethoxylated stearyl methyl quaternary ammonium chloride |
| | Ethoquad C/25 | ethoxylated cocoalkyl methyl quaternary ammonium chloride |
| Ashland | Alkamuls PSMO-20 | ethoxylated (20) sorbitan monooleate |
| | Antarox P-104 | ethoxylated polyoxypropylene |
| | Igepal DM-710 | ethoxylated dinonylphenol/nonophenol (branched) |
| | Rhodafac RE-610 | polyoxyethylene (branched) nonylphenyl ether phosphate |
| | Rhodaquat M-242B/99 | cetyltrimethyl ammonium bromide |
| BYK-Chemie | Anti Terra U80 | unsaturated polyamine amide polymer acid salt, 2-butoxyethanol, xylene (dispersant blend) |
| Uniqema | Renex 30 | ethoxylated $C_{11}$–$C_{14}$ isoalcohols (wetting agent) |
| | Renex 36 | ethoxylated $C_{11}$–$C_{14}$ isoalcohols (wetting agent) |

TABLE 2

% Ceria Results

| Surfactant | 0 hrs. | 26 hrs. | 50 hrs. | 75 hrs. | 170 hrs. | 316 hrs. |
| --- | --- | --- | --- | --- | --- | --- |
| Control | 1.11 | 0.85 | 0.65 | 0.63 | 0.56 | 0.51 |
| CT-131 | 1.15 | 0.73 | 0.60 | 0.57 | 0.55 | 0.45 |
| CT-141 | 1.09 | 0.51 | 0.52 | 0.47 | 0.45 | 0.40 |
| CT-324 | 1.10 | 0.23 | 0.60 | 0.53 | 0.43 | 0.40 |
| EQ-18/25 | 0.65 | 0.08 | 0.00 | 0.00 | 0.00 | 0.00 |
| EQ-C/25 | 0.72 | 0.09 | 0.00 | 0.00 | 0.00 | 0.00 |
| PSMO-20 | 1.10 | 0.83 | 0.61 | 0.59 | 0.52 | 0.47 |
| P-104 | 1.05 | 0.29 | 0.63 | 0.59 | 0.48 | 0.46 |
| DM-710 | 1.07 | 0.36 | 0.56 | 0.49 | 0.43 | 0.42 |
| RE-610 | 0.86 | 0.33 | 0.25 | 0.22 | 0.24 | 0.18 |
| M-242B/99 | 0.03 | 0.03 | 0.00 | 0.00 | 0.00 | 0.00 |
| AT-U80 | 1.10 | 0.35 | 0.44 | 0.40 | 0.33 | 0.30 |
| RX-30 | 1.11 | 0.70 | 0.60 | 0.49 | 0.43 | 0.40 |
| RX-36 | 1.08 | 0.65 | 0.59 | 0.55 | 0.42 | 0.40 |

TABLE 3

% Alumina Results

| Surfactant | 0 hrs. | 27 hrs. | 51 hrs. | 75 hrs. | 170 hrs. | 317 hrs. |
| --- | --- | --- | --- | --- | --- | --- |
| Control | 1.09 | 0.14 | 0.12 | 0.13 | 0.00 | 0.00 |
| CT-131 | 1.16 | 0.50 | 0.41 | 0.32 | 0.25 | 0.19 |
| CT-141 | 1.19 | 0.67 | 0.50 | 0.40 | 0.29 | 0.21 |
| CT-324 | 1.11 | 0.08 | 0.07 | 0.07 | 0.00 | 0.00 |
| EQ-18/25 | 1.04 | 0.56 | 0.36 | 0.28 | 0.21 | 0.14 |
| EQ-C/25 | 1.04 | 0.38 | 0.20 | 0.18 | 0.00 | 0.00 |
| PSMO-20 | 1.16 | 0.18 | 0.15 | 0.15 | 0.00 | 0.00 |
| P-104 | 1.10 | 0.20 | 0.16 | 0.16 | 0.00 | 0.00 |
| DM-710 | 1.23 | 0.18 | 0.15 | 0.15 | 0.00 | 0.00 |
| RE-610 | 1.15 | 0.94 | 0.82 | 0.76 | 0.59 | 0.55 |
| M-242B/99 | 1.06 | 0.65 | 0.48 | 0.40 | 0.25 | 0.20 |
| AT-U80 | 0.61 | 0.38 | 0.31 | 0.26 | 0.21 | 0.15 |
| RX-30 | 1.10 | 0.16 | 0.15 | 0.14 | 0.00 | 0.00 |
| RX-36 | 1.18 | 0.86 | 0.69 | 0.40 | 0.39 | 0.28 |

The results of ceria settling for the Hitachi STI slurry are summarized in Table 2. The ceria control dilution showed minimal settling relative to all experimental solutions over the thirteen day period. Such may be due to the ingredients of the Hitachi STI slurry that encourage dispersal of ceria abrasive material and, thus, discourage settling. Notably, some surfactants caused ceria to settle much faster than the control. In particular, both Ethoquads (EQ-18/25 and EQ-C/25) and Rhodaquat (M-242B/99) caused such rapid settling that agitation did not restore the original (as-prepared) ceria concentration. Accordingly, the ceria concentration indicated for time 0 is much less than the approximate 1 wt % loading of the other dilutions. These three surfactants are cationic and are the only quaternary ammonium salts among the thirteen surfactants.

Some of the dilutions showed the strange effect of initially dropping in ceria concentration, then increasing in concentration, and then dropping again. This is typical of oscillating chemical reactions governed by the kinetics of two competing equilibria. Some other solutions showed minimal difference in settling as compared to the control. Only the three quaternary ammonium salts produced complete settling of ceria by completion of the thirteen day trial.

The results of alumina settling are summarized in Table 3. The alumina in the Rodel WCMP slurry dilution without a surfactant (the control dilution) settled quickly. Approximately 90% of the initial alumina settled within 24 hours. Most of the surfactants had little effect on alumina settling compared to the control dilution, suggesting minimal interaction. Some surfactants showed moderate dispersion of alumina, reducing the degree of settling compared to the control dilution with 20–30 wt % of the initial alumina remaining after thirteen days. One surfactant, Rhodafac (RE-610), provided enough dispersion to keep approximately 50% of the original alumina dispersed after thirteen days. Rhodafac is an anionic surfactant and the only phosphate among the thirteen surfactants.

Using setup conditions and the first three days of settling data, first order settling rate constants were calculated using the equation set forth above and a one-hour settling rate constant was determined for each surfactant as applied to both ceria and alumina. The one-hour settling rate constants are listed in Table 4 below. Notably, the higher settling rate constants correspond to higher settling rates. As expected, the two Ethoquads and Rhodaquat exhibited the highest settling rate constants for ceria abrasive material.

TABLE 4

Settling Rate Constants (1-hour)

| Surfactant | Ceria | Alumina |
|---|---|---|
| Control | 0.010 | 0.051 |
| PSMO-20 | 0.011 | 0.046 |
| CT-131 | 0.013 | 0.024 |
| RX-30 | 0.014 | 0.048 |
| RX-36 | 0.015 | 0.013 |
| CT-141 | 0.020 | 0.018 |
| DM-710 | 0.023 | 0.046 |
| P-104 | 0.025 | 0.044 |
| AT-U80 | 0.026 | 0.030 |
| CT-324 | 0.028 | 0.065 |
| RE-610 | 0.033 | 0.008 |
| EQ-C/25 | 0.098 | 0.035 |
| EQ-18/25 | 0.102 | 0.024 |
| M-242B/99 | 0.136 | 0.018 |

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A chemical-mechanical polishing (CMP) method comprising:
    applying a solid abrasive material to a substrate;
    flocculating at least some of the abrasive material; and
    removing at least some of the abrasive material.

2. The CMP method of claim 1 further comprising polishing the substrate with the abrasive material before the flocculating.

3. The CMP method of claim 1 wherein the abrasive material comprises ceria.

4. The CMP method of claim 1 wherein the flocculating comprises applying a surfactant comprising material to the substrate and flocculating at least a majority portion of the abrasive material with the surfactant.

5. The CMP method of claim 4, wherein the surfactant comprises a cationic surfactant.

6. The CMP method of claim 5, wherein the cationic surfactant comprises a quaternary ammonium substituted salt.

7. A CMP method comprising:
    applying a solid abrasive material to a substrate;
    polishing the substrate with the abrasive material;
    after polishing, brush scrubbing the substrate using a scrubbing solution comprising a surfactant material to flocculate and remove at least a majority portion of the abrasive material.

8. The CMP method of claim 7, wherein the abrasive material comprises ceria.

9. The CMP method of claim 7, wherein the surfactant comprises a cationic surfactant.

10. The CMP method of claim 9, wherein the cationic surfactant comprises a quaternary ammonium substituted salt.

11. A CMP method comprising:
    applying a solid abrasive material to a substrate;
    polishing the substrate with the abrasive material;
    after polishing, pressure spraying the substrate using a spray solution comprising a surfactant material to flocculate and remove at least a majority portion of the abrasive material.

12. The CMP method of claim 11, wherein the abrasive material comprises ceria.

13. The CMP method of claim 11, wherein the surfactant comprises a cationic surfactant.

14. The CMP method of claim 13, wherein the cationic surfactant comprises a quaternary ammonium substituted salt.

15. A CMP method comprising:
    applying a solid, ceria-comprising abrasive material to a substrate;
    polishing the substrate with the abrasive material;
    applying a surfactant material comprising quaternary ammonium substituted salt to the substrate and flocculating and complexing at feast some of the abrasive material with the surfactant material; and
    removing at least a majority portion of the abrasive material.

16. The CMP method of claim 15, wherein a concentration of the surfactant in the surfactant comprising material comprises about 10 micrograms per milliliter (μg/ml) to about 10,000 μg/ml.

17. The CMP method of claim 15, wherein a temperature of the substrate during the flocculating does not exceed about 40 degrees Celsius (C).

18. The CMP method of claim 15, wherein the quaternary ammonium substituted salt comprises a quaternary ammonium halide.

19. The CMP method of claim 18, wherein the quaternary ammonium halide comprises a cetyltrimethylammonium bromide.

20. The CMP method of claim 18, wherein the quaternary ammonium halide comprises a polyethoxylated quaternary ammonium halide.

* * * * *

UNITED STATES PATENT AND TRADEMARK OFFICE
CERTIFICATE OF CORRECTION

PATENT NO. : 7,066,790 B2  Page 1 of 1
APPLICATION NO. : 10/108067
DATED : June 27, 2006
INVENTOR(S) : Michael T. Andreas It is certified that error appears in the above-identified patent and that said Letters Patent is hereby corrected as shown below:

Column 8, claim 15, line 62
Replace "lating and complexing at feast some of the abrasive"
With --lating and complexing at least some of the abrasive--

Signed and Sealed this

Twenty-ninth Day of May, 2007

JON W. DUDAS
*Director of the United States Patent and Trademark Office*